US011202386B2

(12) United States Patent
Hjelmfelt et al.

(10) Patent No.: US 11,202,386 B2
(45) Date of Patent: Dec. 14, 2021

(54) MODULAR CABLE MANAGEMENT SYSTEM

(71) Applicant: HEWLETT PACKARD ENTERPRISE DEVELOPMENT LP, Houston, TX (US)

(72) Inventors: Trevor C. Hjelmfelt, Ft. Collins, CO (US); Benjamin Yin Siu, Milpitas, CA (US); Michael Renfro, Randolph, KS (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/147,373

(22) Filed: Sep. 28, 2018

(65) Prior Publication Data

US 2020/0107466 A1    Apr. 2, 2020

(51) Int. Cl.
| | | |
|---|---|---|
| *H05K 7/14* | (2006.01) | |
| *F16L 3/015* | (2006.01) | |
| *F16L 3/12* | (2006.01) | |
| *F16L 3/13* | (2006.01) | |
| *F16L 3/127* | (2006.01) | |
| *H02B 1/20* | (2006.01) | |

(52) U.S. Cl.
CPC ............ *H05K 7/1491* (2013.01); *F16L 3/015* (2013.01); *F16L 3/127* (2013.01); *F16L 3/1222* (2013.01); *F16L 3/13* (2013.01); *H05K 7/1492* (2013.01); *H02B 1/202* (2013.01); *H05K 7/1448* (2013.01)

(58) Field of Classification Search
CPC .. H05K 7/1491; H05K 7/1492; H05K 7/1447; H05K 7/1448; H05K 7/1449; H05K 7/1451; F16L 3/015; F16L 3/1222; F16L 3/127; F16L 3/13; H02B 1/202
See application file for complete search history.

(56) References Cited

U.S. PATENT DOCUMENTS

| | | | |
|---|---|---|---|
| 6,109,569 A | 8/2000 | Sakaida | |
| 6,175,079 B1 * | 1/2001 | Johnston | G02B 6/4452 174/50 |
| 6,327,139 B1 * | 12/2001 | Champion | H02B 1/202 174/69 |

(Continued)

OTHER PUBLICATIONS fs.com, "1U 19in Blank Rackmount Fiber Patch Panel with Cable Management Panel and Lacing Bar," 2018, pp. 1-6 (online), Retrieved from the Internet on May 22, 2018 at URL: <fs.com/products/59576>.

*Primary Examiner* — Rockshana D Chowdhury
*Assistant Examiner* — Douglas R Burtner
(74) *Attorney, Agent, or Firm* — Hewlett Packard Enterprise Patent Department

(57) ABSTRACT

An example modular cable management system, that includes a base to attach to a support structure and a number of cable management modules to attach to the base. The base may include an attachment feature that is to attach to the supporting structure to vertically support the base, and an arm that extends from the attachment feature to which the cable management modules attach. The cable management module may include a clip and a loom. The clip may be attachable to the arm such that the clip is rotatable about a longitudinal axis of the arm and may be removable from the arm. The loom may be attachable to and removable from the clips and configured to hold multiple cables.

17 Claims, 13 Drawing Sheets

(56) References Cited

U.S. PATENT DOCUMENTS

| | | | | |
|---|---|---|---|---|
| 6,340,317 B1* | 1/2002 | Lin | H01R 9/2416 | 174/60 |
| 6,501,899 B1* | 12/2002 | Marrs | G02B 6/4452 | 385/134 |
| 6,590,785 B1* | 7/2003 | Lima | H04Q 1/06 | 174/69 |
| 6,671,447 B1* | 12/2003 | Gehrke | G02B 6/4471 | 385/134 |
| 7,026,553 B2* | 4/2006 | Levesque | H02G 3/0493 | 174/100 |
| 8,233,762 B1* | 7/2012 | Boyden | G02B 6/4452 | 385/134 |
| 8,363,998 B2* | 1/2013 | Newman | H04Q 1/062 | 385/135 |
| 8,730,678 B1* | 5/2014 | Cunningham | H05K 7/1491 | 361/725 |
| 9,212,765 B1 | 12/2015 | Chia et al. | | |
| 9,411,117 B1* | 8/2016 | Goodsell | H01R 9/2416 | |
| 9,699,936 B1* | 7/2017 | Vargas | H05K 7/1491 | |
| 9,711,952 B2* | 7/2017 | Lutze | H02B 1/34 | |
| 9,867,311 B2 | 1/2018 | Chen | | |
| 2007/0246613 A1* | 10/2007 | Kennedy | H02G 3/32 | 248/56 |
| 2008/0093120 A1* | 4/2008 | Nakayama | H05K 7/1448 | 174/480 |
| 2010/0166378 A1* | 7/2010 | Taylor | H04Q 1/021 | 385/135 |
| 2010/0193754 A1* | 8/2010 | Garza | H04Q 1/035 | 254/134.3 CL |
| 2010/0200707 A1* | 8/2010 | Garza | H04Q 1/062 | 248/68.1 |
| 2011/0081113 A1* | 4/2011 | Jones | G02B 6/3879 | 385/62 |
| 2011/0180295 A1* | 7/2011 | Krietzman | H04Q 1/149 | 174/50 |
| 2013/0334374 A1* | 12/2013 | Notaro | F16L 3/223 | 248/65 |
| 2015/0362095 A1* | 12/2015 | Notaro | F16L 3/223 | 248/558 |
| 2017/0179707 A1* | 6/2017 | Gutgold | H02G 15/00 | |
| 2018/0080579 A1* | 3/2018 | Costigan | F16L 3/1075 | |
| 2018/0110153 A1* | 4/2018 | Hennrich | E05F 1/1207 | |
| 2018/0199117 A1* | 7/2018 | Mankinen | H04Q 1/142 | |
| 2018/0231730 A1* | 8/2018 | Geens | G02B 6/3897 | |
| 2018/0335595 A1* | 11/2018 | Takeuchi | G02B 6/3897 | |
| 2019/0104638 A1* | 4/2019 | Shimasaki | H05K 7/183 | |
| 2019/0380221 A1* | 12/2019 | Gupta | H05K 7/1447 | |
| 2020/0137919 A1* | 4/2020 | Gupta | F16L 3/16 | |
| 2021/0011239 A1* | 1/2021 | Geens | G02B 6/4444 | |
| 2021/0116666 A1* | 4/2021 | Kaml | G02B 6/443 | |

* cited by examiner

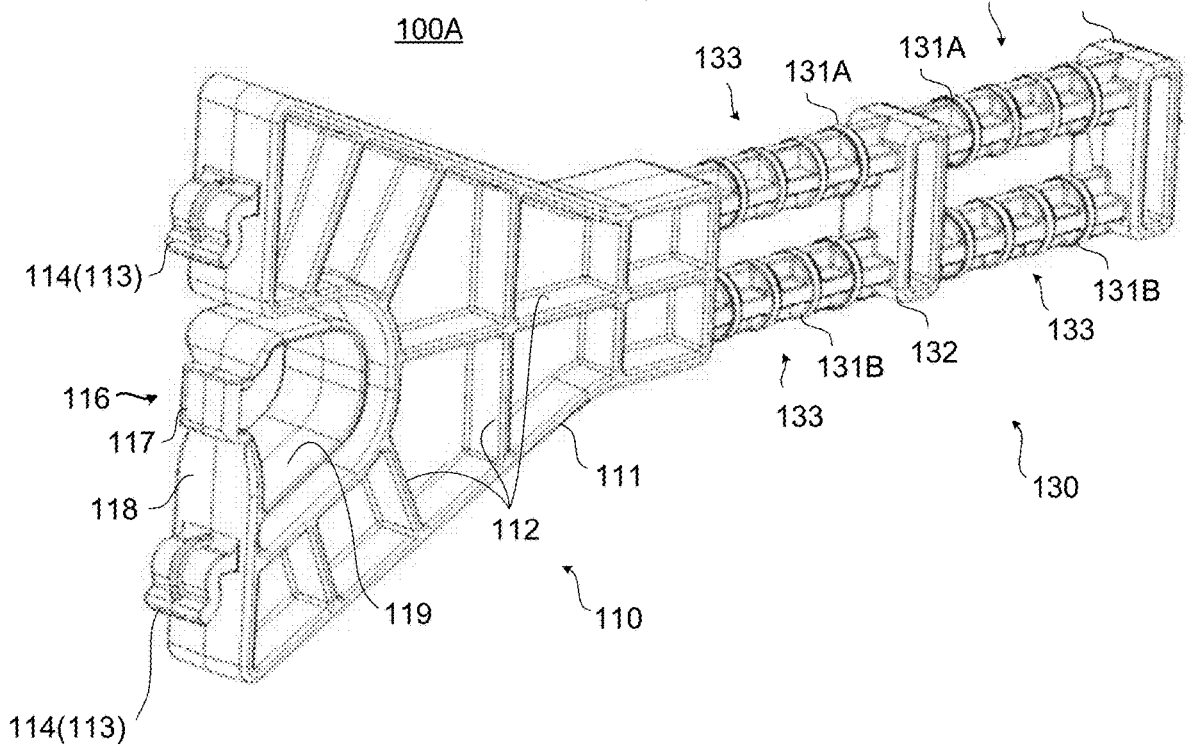
Fig. 2A
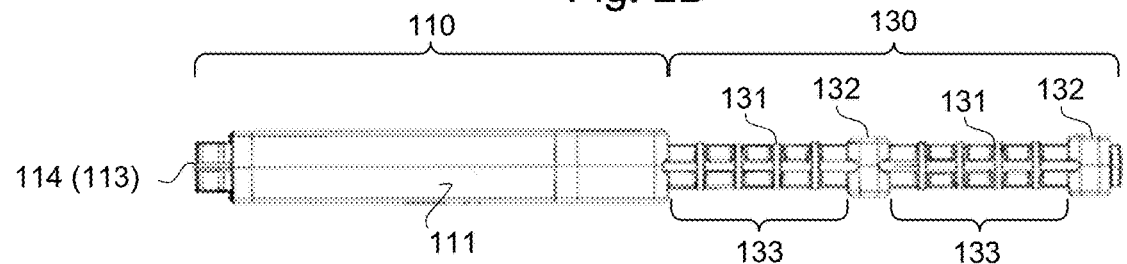
Fig. 2B
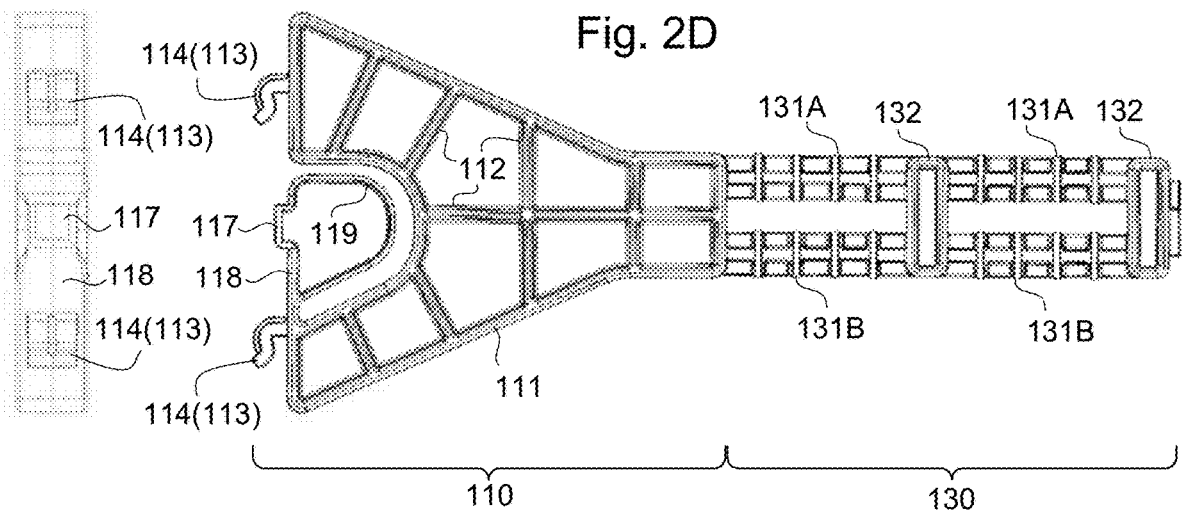
Fig. 2C
Fig. 2D

Fig. 3A
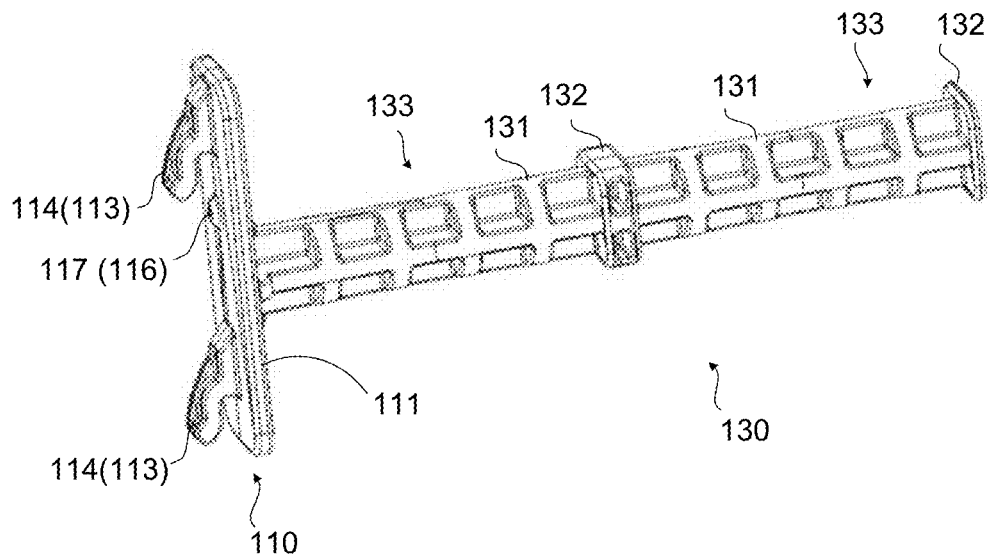
Fig. 3B
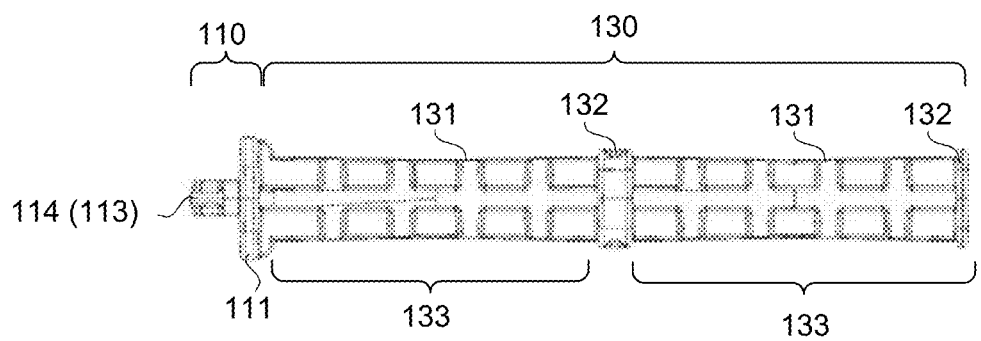
Fig. 3C
Fig. 3D
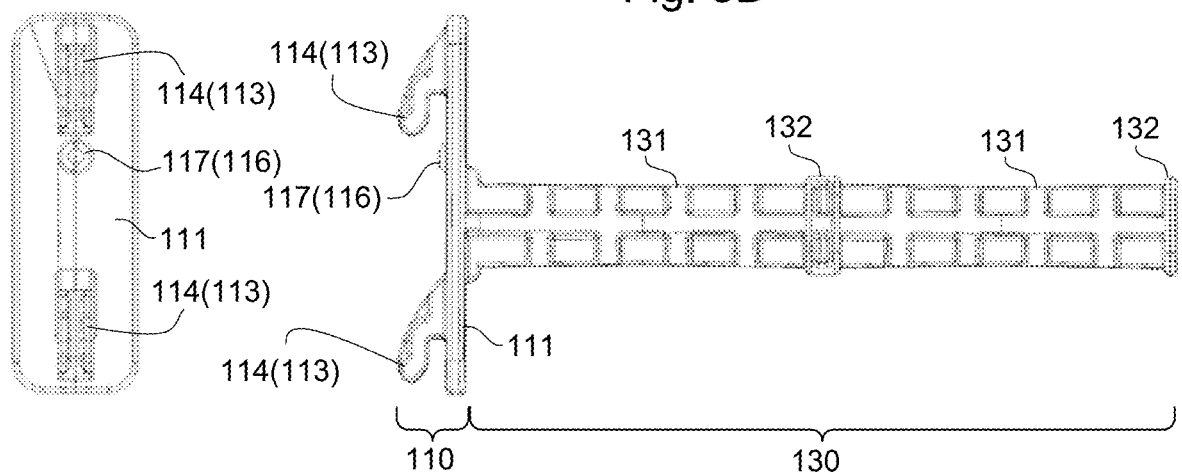

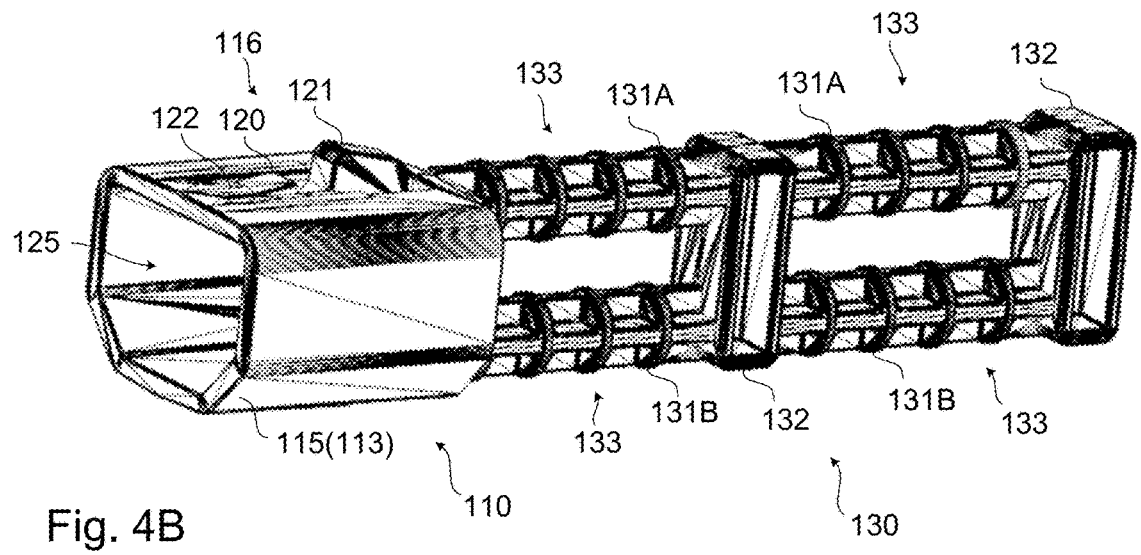
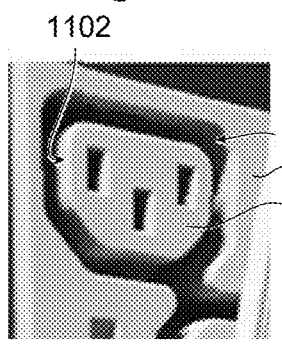
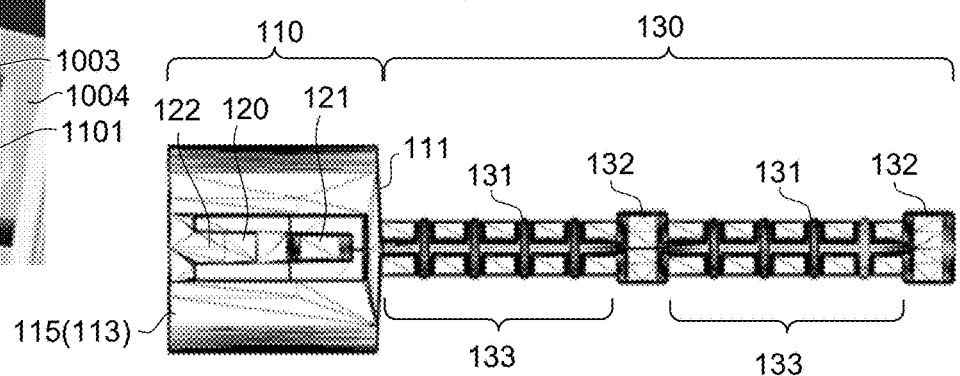
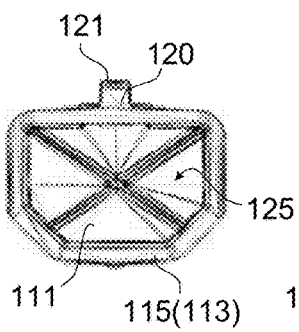
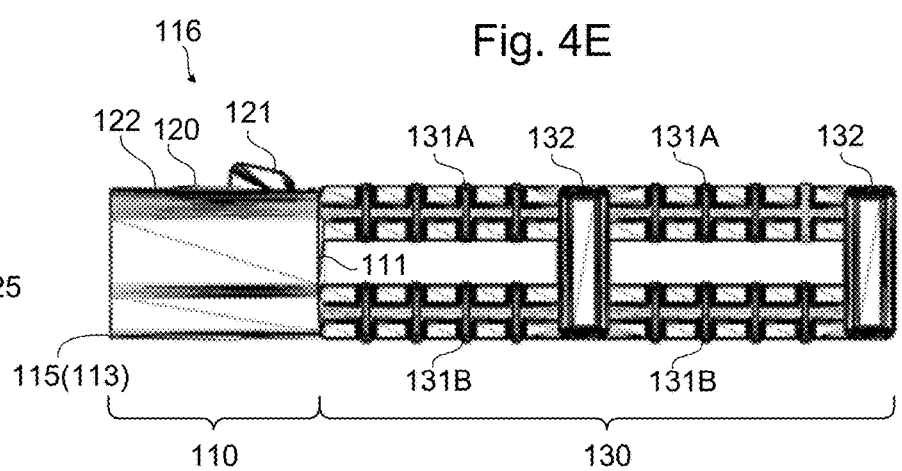

MODULAR CABLE MANAGEMENT SYSTEM

BACKGROUND

A computing system may include one or more devices, such as computing devices, networking devices, storage devices, etc. The various devices may be connected to one another and/or to other devices using cables.

BRIEF DESCRIPTION OF THE DRAWINGS

FIGS. 2A-D illustrate a first example base of the example modular cable management system. FIG. 2A illustrates a perspective view of the first example base. FIG. 2B illustrates a top plan view of the first example base. FIG. 2C illustrates a left side plan view of the first example base. FIG. 2D illustrates a front plan view of the first example base.

FIGS. 3A-D illustrate a second example base of the example modular cable management system. FIG. 3A illustrates a perspective view of the second example base. FIG. 3B illustrates a top plan view of the second example base. FIG. 3C illustrates a left side plan view of the second example base. FIG. 3D illustrates a front plan view of the second example base.

FIGS. 4A-E illustrate a third example base of the example modular cable management system. FIG. 4A illustrates a perspective view of the third example base. FIG. 4B illustrates an example electrical socket that is to mate with a connector of the third example base. FIG. 4C illustrates a top plan view of the third example base. FIG. 4D illustrates a left side plan view of the third example base. FIG. 4E illustrates a front plan view of the third example base.

FIG. 5A illustrates a perspective view of the example clip. FIG. 5B illustrates a top plan view of the example clip. FIG. 5C illustrates a left side plan view of the example clip. FIG. 5D illustrates a front plan view of the example clip. FIG. 5E illustrates a bottom plan view of the example clip.

FIG. 6A illustrates a perspective view of the first example loom. FIG. 6B illustrates a front plan view of the first example loom.

FIG. 7A illustrates a perspective view of the second example loom. FIG. 7B illustrates a front plan view of the second example loom.

FIG. 8A illustrates a perspective view of the third example loom. FIG. 8B illustrates a top plan view of the third example loom. FIG. 8C illustrates a front plan view of the third example loom.

DETAILED DESCRIPTION

1. Introduction

Figure 1:
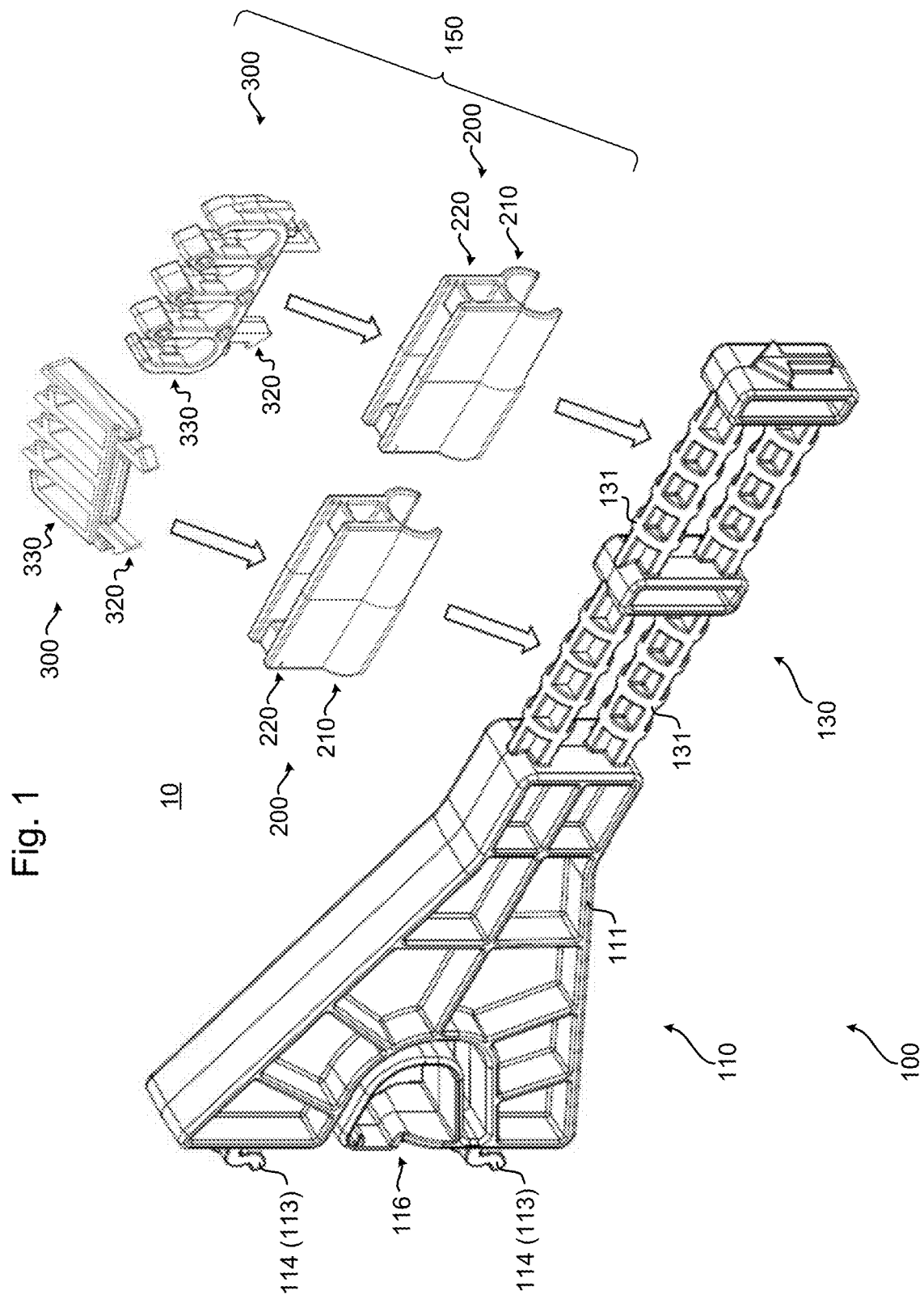
FIG. 1 illustrates an exploded perspective view of an example modular cable management system.
Figure 5A:
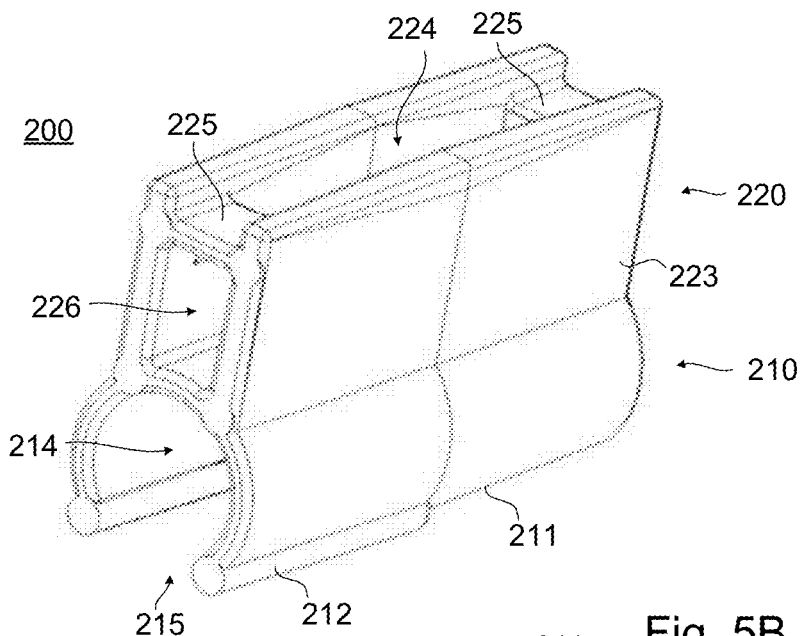
FIGS. 5A-E illustrate an example clip of the example modular cable management system.
Figure 5B:
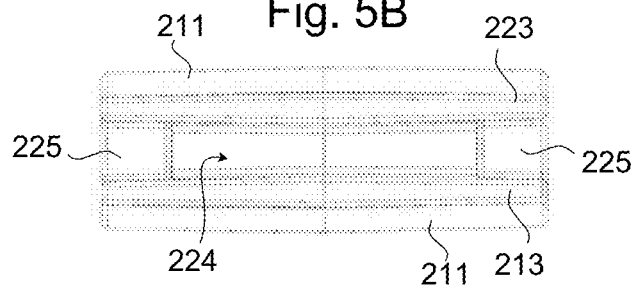
Figure 5C:
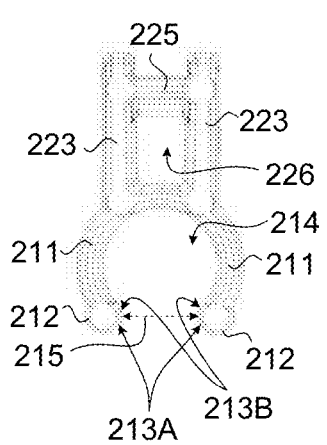
Figure 5D:
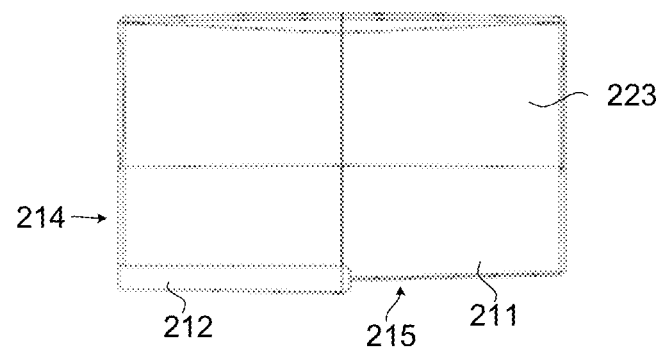
Figure 5E:
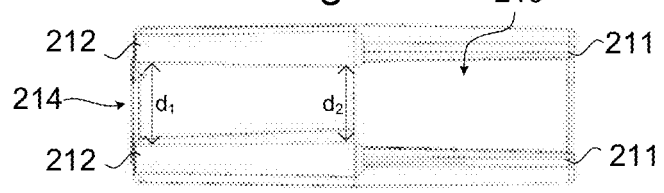

In many computing systems, the density of components is high and space within enclosures of the computing system is at a premium. In addition, many computing systems use large numbers of cables, including communications cables, power cables, and the like. In particular, in multi-unit racks or cabinets, which may contain multiple pieces of equipment (e.g., computing devices, networking devices, storage devices, telecommunications equipment, etc.), there may be dozens of cables and very little free space. This makes installation, upgrades and service of these systems very difficult. For example, the cables may become a disorganized tangle which may make it difficult to trace one of the cables from one end to another (e.g., to identify connections between devices), much less remove or replace a faulty cable or device.

Thus, disclosed herein are example modular cable management systems that may be used to organize the cables of a computing system, such as a multi-device rack or cabinet. The example modular cable management systems disclosed herein include cable management modules that are designed to receive and hold cables in an organized fashion.

The cable management modules include cable looms that hold the cables and a clip that is connectable to and removable from a supporting arm without requiring tools. In some examples, the clip and loom are separate parts that may be attached to and detached from one another without requiring tools. The clip may be rotatable about the longitudinal axis of the arm.

The supporting arm is configured to attach to a supporting structure, such as a part of the enclosure of the computing system, and vertically support the cable management modules connected thereto. In some examples, the arm may be configured to hold multiple cable management modules. In some examples, different types of looms, which may be designed to hold different types of cables, may be used, and these different types of looms may be mixed and matched on the same supporting arm.

In addition to merely helping to organize the cables and increase the general tidiness of the enclosure, the cable management systems disclosed herein may provide specific benefits that might not be possible with other approaches to cable management.

For example, the example cable management systems disclosed herein may make it possible for a technician to more easily trace the connections of a cable. For example, the looms may include a row of tines that form distinct cable retainers that each hold a subset of cables and keeps those cables separated from other cables held in other cable retainers. This keeps the cables from becoming a large undifferentiated mass in which it is difficult to trace cable connections. In some examples, each cable retainers may each hold two cables in a stacked configuration (e.g., one directly above the other), which makes tracing cables much easier.

As another examples, the example cable management systems disclosed herein may make it possible to easily add cables to or remove cables from the management system without disturbing very many of the cables already held by the system. For example, the cable retainers of the looms may include openings that remain open even while the retention space continues to hold cables, thus enabling cables to be added to or removed from the cable retainers via the openings without necessarily having to release the other cables from the cable retainer. In addition, the looms may be designed to hold the cables such that a cable can be removed from the loom without requiring tools, thus simplifying the process of adding/removing cables. In addition, because each cable retainer holds only a subset of the total group of cables that are held by the cable management system, even if removing a cable from the system does necessitate disturbing the other cables in the same cable retainer, it does not affect all of the cables held by the system.

As another example, the cable management systems disclosed herein may provide flexibility in how they hold the cables. In particular, the looms may be connected to the supporting arm so as to be rotatable about an axis of the arm. This may enable the loom to assume the orientation that is best for the cables in view of the directions in which they tend to run, which can help to avoid stressing or kinking cables (especially cables that are sensitive to sharp bends, like optical cables). In addition, it enables one loom to be connected to the arm and face one direction, while a second loom is connected to the arm and facing an entirely different direction, thus enabling the configuration of the system to be tailored at the time of installation to better match the particular needs of a given enclosure without needing to know those specific needs at the time of manufacturing the cable management system. In addition, because different types of looms for different types of cables may be mixed-and-matched in the modular cable management system, the system can be tailored at the time of installation to better match the particular needs of the given enclosure without needing to know those specific needs at the time of manufacturing the cable management system.

As another example, the cable management modules of the cable management system may be easily attached to and removed from the supporting arm without needing any tools. This may greatly simplify the installation, and subsequent modification, of the cable management system.

To help illustrate the above-noted benefits of the examples disclosed herein, an alternative approach to organizing and securing cables will be considered as a contrasting example. In this alternative approach, a technician bundles groups of cables together, for example using zip ties or hook-and-latch type ties, and secures these bundles to the enclosure.

However, although this alternative approach does increase the tidiness of the enclosure, it still does not enable a service technician to trace connections of the cables, since all of the cables in a particular bundle are bunched together in one mass. For example, a cable that is not on a perimeter of a bundle would be nearly impossible to trace. In contrast, the looms of the examples disclosed herein can hold the cables in small distinct groups that are kept separated from one another in an organized fashion, enabling individual cables to be traced.

In addition, this alternative approach makes it very difficult to add or remove cables, as the wrap or tie must be entirely undone to add a cable to or remove a cable from the bundle, which releases the other cables that were being held by the wrap or tie. In addition, some wraps or ties, such as zip ties, would have to be destroyed (e.g., cut) in order to allow a cable to be added or removed. In contrast, the examples disclosed herein allow cables to be added or removed easily without disturbing all of the cables held by the system.

In addition, this alternative approach does not really take into account the different types of cables that may be used in a system and how they may require different means of retaining them. Specifically, different types of cables may have a wide variety of diameters and handling requirements such as minimal bend radiuses to protect the cables from damage. Thus, for example, a zip tie that is too narrow could cut into the outer shielding of some cables, while being okay for other cables. Wraps and ties can also be over tightened, which may result in cutting into the cables. In contrast, the example modular cable management systems disclosed herein have different cable looms designed to handle a specific type of cable, and the ability of the looms to rotate around the arm may help to keep cables from exceeding their minimum bend radii.

In addition, in some alternative approaches, the groups of cables and/or the management systems that hold the cables, are fixed relative to the enclosure. In the case of wraps or ties, the bundles may be tied to the enclosure. In the case of other management systems (e.g., a rigid cable holder), the management system itself may be fixed to the enclosure. Thus, in these approaches, if some or all of the cables need to be moved, say to provide access to a particular part of the system for a repair, then either the cables must be released from the management system (e.g., zip ties cut, or cables removed from a cable holder) or the cables may be pushed/pulled aside while staying attached to the enclosure. In the former case, the cables may become a disorganized mess again and may require extra work to re-organize when the task requiring the access is completed. In the latter case, the cables may become damaged due to being forced aside, and even if not damaged the effort needed to force the cables aside increases the difficulty of whatever the technician is trying to do. In contrast, in examples disclosed herein, the looms may be easily detached from the supporting arm without needing to release the cables held thereby, thus enabling a particular group of cables or all of the cables to be moved aside or separated without having to release the cables from the management system and without having to force or bend the cables. After the task is completed the, looms can simply be reattached to the supporting arm without having to reorganize the cables.

Specific examples of the cable management system will now be described in greater detail in section 2 below.

2. Example Modular Cable Management System

FIGS. 1-8 illustrate an example modular cable management system 10 (also referred to as "system 10"). Certain features of the system 10 are visible in multiple figures of FIGS. 1-8, and therefore specific figures will not always be called out in the description below when a feature is described. Occasionally a specific Figure will be called out if it is considered particularly helpful or relevant to an aspect of a feature being described.

The system 10 includes a base 100 and one or more cable management modules 150. Each of the cable management modules 150 includes a clip 200 to attach to the base 100 and a loom 300 to receive and hold cables in an organized manner.

In some examples, the cable management modules 150 may be configured to be connected to and removed from the base 100 without requiring any tools. In addition, the cable management modules 150 may be configured to be rotatable around the base 100 while connected thereto.

In some examples, multiple cable management modules 150 may be connected to the base 100 at the same time. In some examples, different types of cable management modules 150 that are designed to hold different types of cables may be included in the system 10, and may be mixed-and-matched on the base 100 (i.e., different types of cable management modules 150 may be used together on the same base 100).

FIGS. 1-8 illustrate examples in which the clip 200 and loom 300 are distinct parts that are connectable to and removable from one another, but in other examples the clip 200 and loom 300 are permanently connected to one another.

The above-note components of the example modular cable management system 10 will be described in greater detail in sections 2.1 to 2.3 below.

2.1 Example Bases 100

FIGS. 1-4 illustrate examples of the base 100. Certain features may be common to the various examples of the base 100, and thus will be described below without specifying a particular example. Other features may be specific to a particular example of the base 100, in which case the particular example will be noted.

The base 100 includes an attachment portion 110 that is to attach to a support structure, and an arm portion 130 to which the clips 200 of the cable management modules 150 may be attached.

The arm portion 130 is connected to and extends away from the attachment portion 110. The arm portion 130 includes one or more arms 131 that are configured to receive the clips 200. For example, arms 131 may have a generally round cross-sectional profile (e.g., the arms may be cylindrical), which may aid the clips 200 in snapping on to the arms 131 and may also aid in the clips 200 rotating about the arms 131. In the illustrated examples, the arms 131 include lightening features (e.g., portions with material removed) to lighten the base 100, but this need not necessarily be the case. The arms 131 may also have specific attachment regions 133, each sized to receive one of the clips. The attachment regions 133 may be separated from one another by dividers 132, which may also serve to increase the strength/rigidity or the arm portion 130.

For example, in a first example base 100A (see FIGS. 1 and 2) and in a third example base 100C (see FIG. 4), there are two arms 131 (a first arm 131A and a second arm 131B) and four attachment regions 133. As another example, in a third example base 100C (see FIG. 3), there is one arm 131 and two attachment regions 133. These particular numbers of arms 131 and attachment regions 133 per arm 131 are merely examples, and other numbers of arms 131 and/or attachment regions 133 per arm 131 could be included.

The attachment portion 110 includes attachment features 113 that attach the base 100 to the support structure. The attachment features 113 may include any features that are configured to mate with complimentary features of the support structure so as to vertically support the base 100.

For example, in the first example base 100A (see FIG. 2) and the second example base 100B (see FIG. 4), the attachment features 113 include hooks 114 that are configured to be inserted within holes in a support structure, such as holes in a column or wall of an enclosure, and thereby engage the support structure to vertically support the base 100. In some examples, the hooks 114 may be designed to mate with specific types of holes, such as square holes or round holes, with specific spacing's between the holes.

As another example, in the third example base 100C (see FIG. 3), the attachment features 113 include a connector 115 that is to mate with an electrical socket 1101, such as the electrical socket 1101 of a power distribution unit ("PDU") 1100. Specifically, the connector 115 may include walls that form a cavity 125, such that the electrical socket 1101 fits within the cavity 125 when the connector 115 mates with it. The connector 115 may be shaped to follow a profile of the electrical socket 1101 so that the socket 1101 fits snugly within the connector 115 when they are mated, enabling the socket 1101 to vertically supports the system 10. For example, the connector 115 may be inserted into a channel 1103 between an exterior 1102 of the socket 1101 and a surrounding material 1104 (see FIG. 4B). In FIG. 4B, the socket 1101 has a hexagonal profile, and thus the connector 115 also has a hexagonal profile, but it should be understood that the socket 1101 and connector 115 may have other shapes.

The attachment portion 110 may also include a lock 116 that is configured to keep the attachment feature 113 engaged with the support structure, thus locking the base 100 to the support structure.

For example, in the first example base 100A and in the second example base 100B, the lock 116 includes a protrusion 117 that is to engage with a complimentary hole in the support structure once the attachment features 113 have engaged with the support structure. By engaging the hole, the protrusion 117 prevents (or at least resists) the base 100A or 100B being moved vertically relative to the support structure, which prevents the attachment features 113 from disengaging from the support structure.

In the first example base 100A, the lock 116 also includes a cantilever 118 from which the protrusion 117 extends, and a pull 119 that is connected to the cantilever and can be pulled to bend the cantilever and thereby move the protrusion 117. Thus, in the first example base 100A, the protrusion 117 can be pulled out of the hole it was previously engaged with by pulling on the pull 119, thereby freeing the base 100A to be removed from the support structure. In the second example base 100B, the protrusion 117 does not have such a release mechanism, and instead may be released by applying sufficient force to overcome the resistance to vertical movement provided by the protrusion 117 or by pushing on the protrusion 117 from behind.

As another example, in the third example base 100C, the lock 116 may include a latch 120 that is to engage surrounding material 1104 around the socket 1101 so as to prevent the connector 115 from being removed from the socket 1101. The latch 120 may extend from a cantilever 122 that is connected to a top surface of the connector 115, such that by bending the cantilever 122 downward the latch 120 disengages from the surrounding material 1104. In such an example, the lock 116 may also include a tab 121 that may extend from an end of the cantilever 122 to provide a user a convenient surface upon which to push to bend the cantilever 122 downward.

The attachment portion 110 may also include a frame 111 that the attachment features are connected to, and that the arm portion 130 is connected to. Different sizes and shapes of frame 111 may be used. For example, in the first example base 100A (see FIG. 2), the frame 111 is relatively large and extends vertically and horizontally, with trusses 112 to provide additional support. In the second example base 100B (see FIG. 3), the frame 111 is smaller than the frame 111 of the first example base 100A, and includes just one vertical wall. In the third example base 100C (see FIG. 4), the frame 111 includes a vertical wall that forms a back of the container 115.

2.2 Example Clips 200

FIG. 5 illustrates an example of the clip 200. Although the clip 200 is illustrated in FIGS. 1 and 5 as a distinct part from the loom 300, it should be understood that the clip 200 and the loom 300 could be permanently connected together and/or integrally formed as the same part.

The clip 200 is configured to be tool-lessly attachable to and removable from the arm 131 of the base 100. In particular, the clip 200 may be configured to snap-on to and snap-off of the arm 131. In addition, the clip 200 may be configured to attach to the arm 131 in such a manner that the clip 200 is rotatable about a longitudinal axis of the arm 131.

More specifically, the clip 200 may include a c-shaped snap-on feature 210 that is configured to removably snap onto and snap-off of the arm 131. The c-shaped snap-on feature 210 may include a curved wall 211 that has a cross-sectional profile shaped roughly like a "C" or a circle with a bottom section removed. The curved wall 211 forms a channel 214 that has an opening 215 at a bottom thereof. The channel 214 may be sized to receive the arm 131 therein while allowing the clip 200 to rotate about the arm 131. The opening 215 may be narrower than a diameter of the arm 131 at one or more points, such that the c-shaped snap-on feature 210 resists the arm 131 being inserted into or removed from the channel 214. That is, because the opening 215 is narrower than the diameter of the arm 131, the arm 131 must bend the walls 211 outward in order to be inserted in or removed from the channel 214. The walls 211 may be configured to be compliant to allow such bending when sufficient force is applied, thus enabling the clip 200 to snap-on and snap-off the arm 131 when a threshold amount of force is applied and to remain attached to the arm 131 when less than the threshold amount of force is applied.

The c-shaped snap-on feature 210 may include rounded or angled contact surfaces 213 at the opening 215, which may contact the arm 131 when the arm 131 is being inserted into or removed from the channel 215, and may translate vertical movement of the arm 131 into outward bending of the rounded walls 111. For example, first contact surfaces 213A may contact the arm 131 when it is being inserted into the channel 214 via the opening 215, and second contact surfaces 213B that may contact the arm 131 when it is being removed from the channel 214 via the opening 215 (see FIG. 5C).

In some examples, the c-shaped snap-on feature 210 may also include mold ejector aids 212, which are attached to the bottoms of the curved wall 211 and aid in ejecting the clip 200 from a mold. In some examples, the mold ejector aids 212 may also make it easier to snap-on the clip 200 to the arm 131. The mold ejector aids 212 may have roughly circular cross-sectional profiles and may be thicker than the curved wall 211. The thickness of the mold ejector aides 212 may taper along their length, so that a distance $d_1$ between the mold ejector aids 212 at one end thereof is greater than a distance $d_2$ between the mold ejector aids 212 at the other end thereof (see FIG. 5E). This may make it easier to snap the clip 200 onto the arm 131 and to retain the arm 131 within the channel 214.

The clip 200 may also include a loom retainer 220 that is to be connected to the loom 300. The loom retainer 220 includes vertical support walls 223 that connect to the curved walls 211 of the c-shape snap-on feature 210. The vertical walls define a loom cavity 224 therebetween, in which part of the loom may be received when the loom 300 is connected to the clip 200. The loom retainer 220 also includes horizontal walls 225 that connect the vertical walls 223 together, and provide stops for engaging snap-in latches 320 of the loom 300 to enable the loom 300 to attach to the clip 200. The loom retainer 220 may include release openings 226 in which a user may insert a tool to release the snap-in latches 320.

2.3 Example Looms 300

Figure 6A:
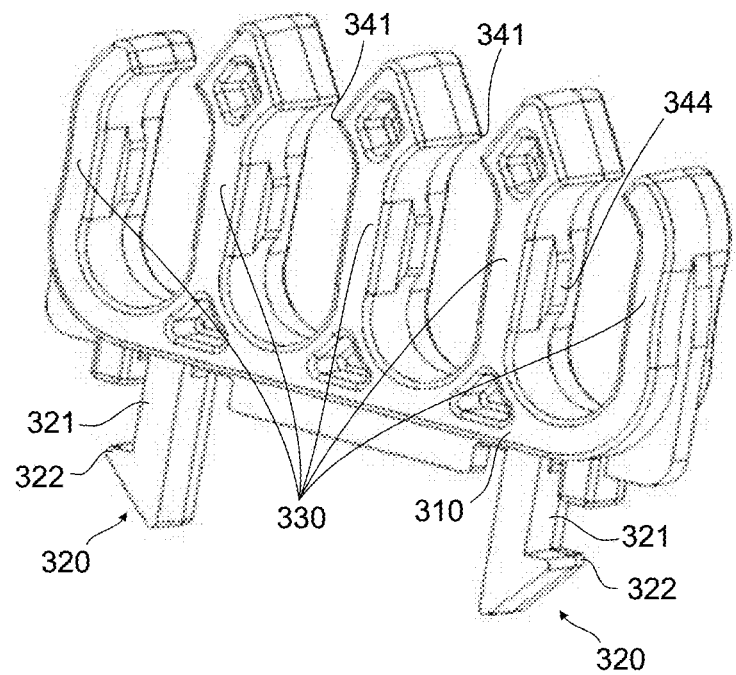
FIGS. 6A-B illustrate a first example loom of the example modular cable management system.
Figure 6B:
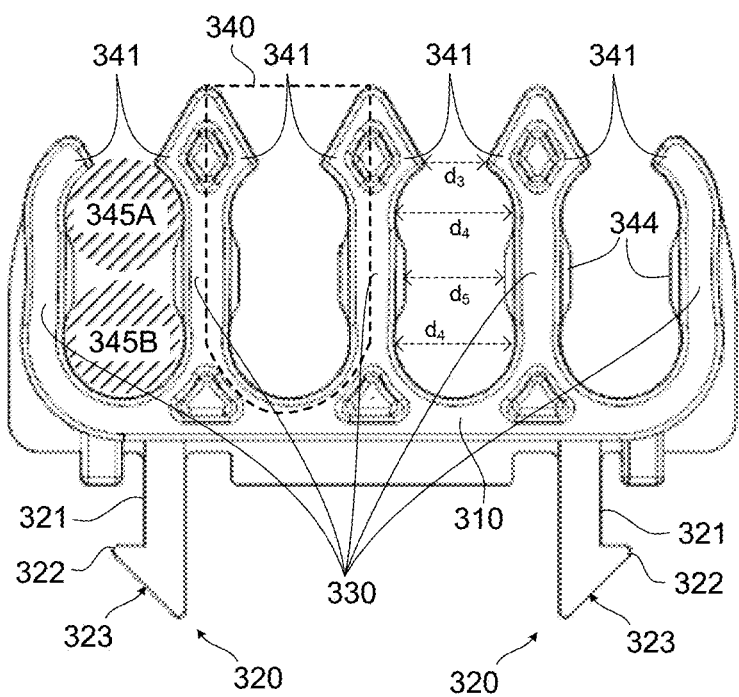
Figure 7A:
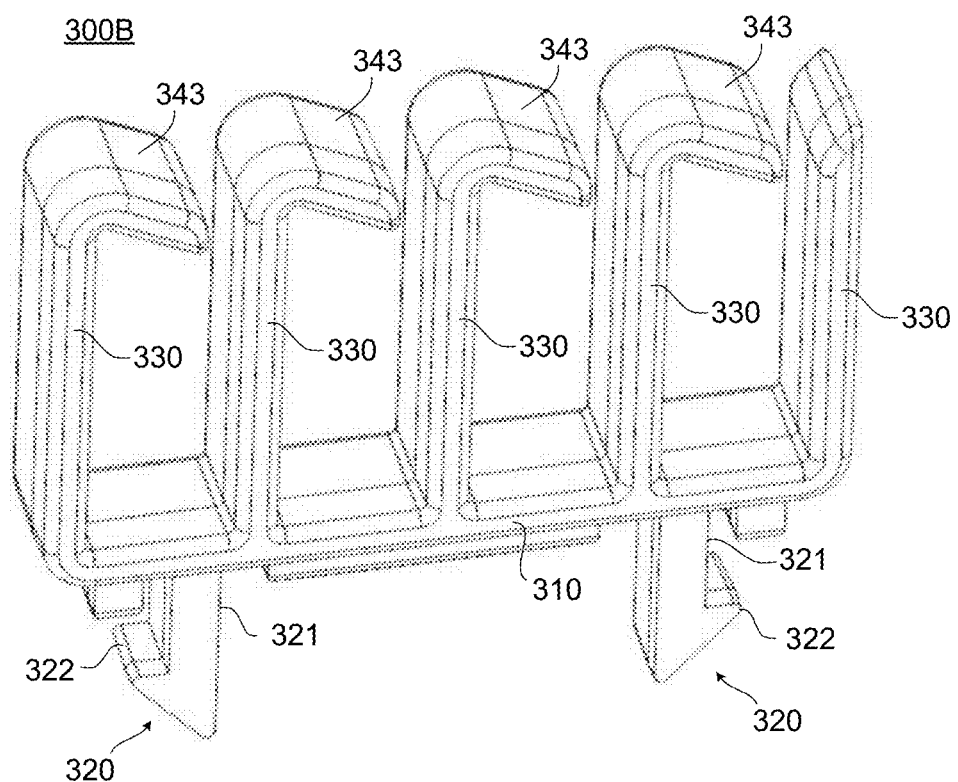
FIGS. 7A-B illustrate a second example loom of the example modular cable management system.
Figure 7B:
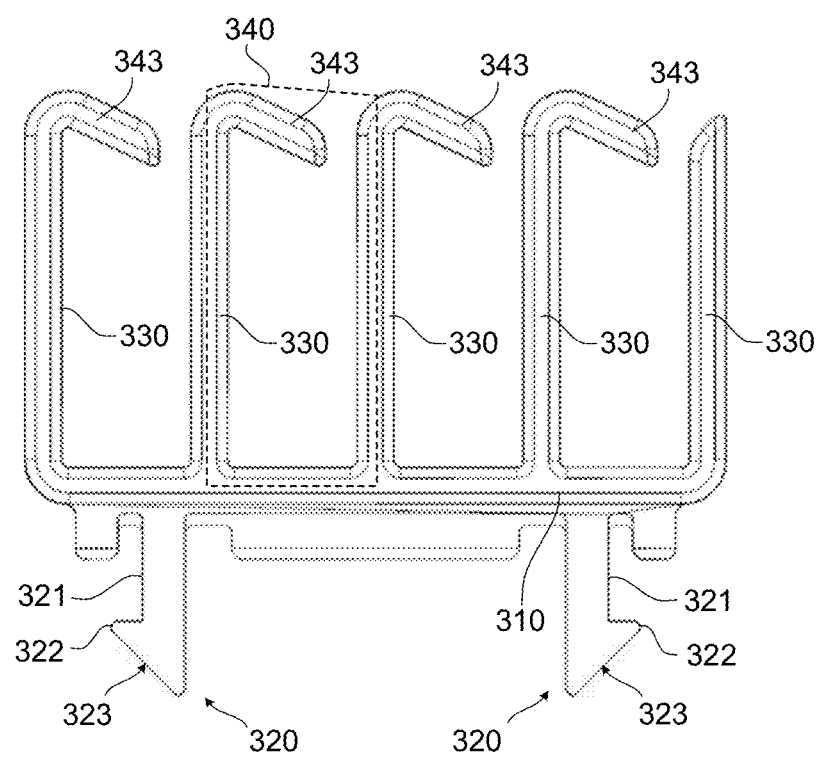
Figure 8A:
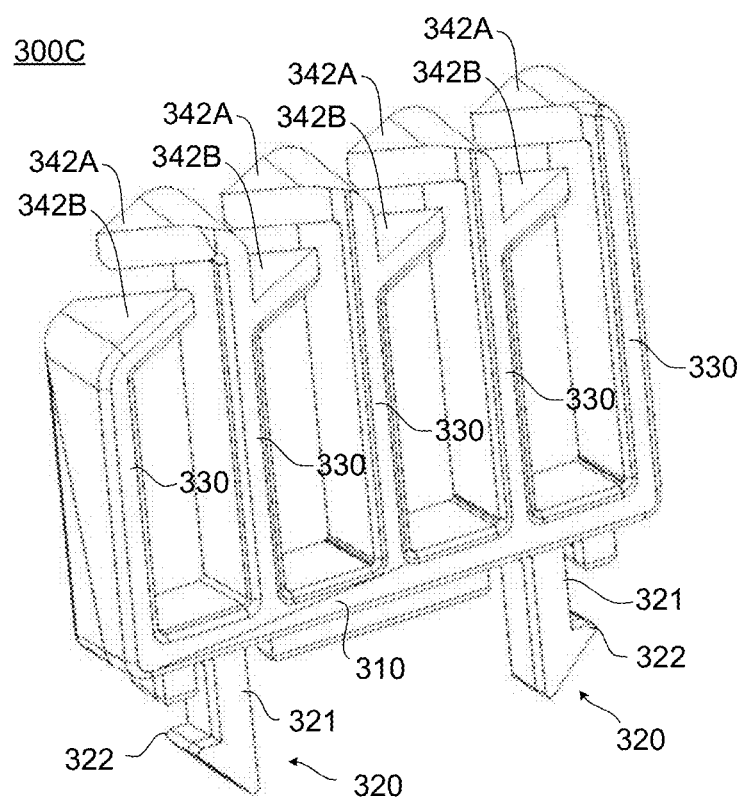
FIGS. 8A-C illustrate a third example loom of the example modular cable management system.
Figure 8B:
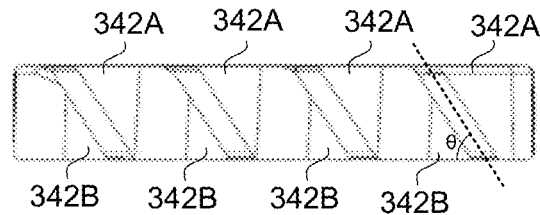

FIGS. 6-8 illustrate examples of the loom 300. Certain features may be common to the various examples of the loom 300, and thus will be described below without specifying a particular example. Other features may be specific to a particular example of the loom 300, in which case the particular example will be noted.

The looms 300 each include a loom base 310, snap-in laches 320 extending from a bottom of the loom base 310, and multiple tines 330 extending from a top of the loom base 310. The tines 330 are arranged in a row, and form multiple cable retainers 340. Each of the cable retainers 340 is formed by two adjacent tines 340, and is configured to hold two or more cables.

The snap-in latches 320 are to snap-into the loom retainer 220 of the clip 200, thereby attaching the loom 300 to the clip 200. For example, the snap-in latches 320 may include a cantilever 321 extending from the loom base 310, a detent 322 extending from the cantilever 321, and an angled contact surface 323. The detent 322 is to engage the bottom of the horizontal wall 225 of the loom retainer 220 when the snap-in latch 320 has been inserted into the loom cavity 224 so as to prevent the loom 300 from separating from the clip 200. The angled contact surface 323 is to contact the horizontal wall 225 and translate relative vertical movement between the two into horizontal movement (i.e., bending) of the cantilever 321, thus enabling the detent 322 to slide past the horizontal wall 225 whereupon the cantilever 321 snaps back so that the detent may engage the bottom of the horizontal wall 225. The snap-in latches 320 may be released by a user inserting a finger or tool through the release openings 226 and pressing the cantilevers 321 inward.

The cable retainers 340 include openings at a top thereof through which cables may be inserted into or removed from the cable retainer 340. The cable retainers 340 may also include retention features to help ensure that cables are retained within the cable retainer 340 until a user deliberately removes one. For example, the retention features may help retain the cables by making an opening of the cable retainer 340 narrower than a diameter of the cables, or by making the opening difficult and/or unlikely for a cable to traverse without being intentionally guided through the opening by a user.

For example, in a first example loom 300A (see FIG. 6), each cable retainer 340 includes snap-on cable retention features 341 extending from the tines 330 that form the cable retainer 340. The snap-on cable retention features 341 of the same cable retainer 340 may extend from their respective tines 330 towards each other. The distance $d_3$ between the apexes of the snap-on cable retention features 341 may be smaller than a diameter of the cables that the loom 300A is designed to hold, and therefore the two adjacent tines 330 must bend away from one another in order for a cable to be inserted into or removed from the cable retainer 340. The snap-on cable retention features 341 may include angled surfaces on a top side and on a bottom side thereof that translate vertical movement of a cable into horizontal movement (bending) of the tines 330. Thus, the snap-on cable retention features 341 enable the cable retainer 340 to snap onto cables (in other words, the cables snap-into the cable retainer 340) when they are pushed with sufficient force relative to one another. The snap-on cable retention features 341 also retain the cables within the cable retainer 340 because the distance $d_3$ is less than the diameter of the cables. The snap-on cable retention features 341 also enable cable retainer 340 to be snapped-off of the cables (in other words, the cables to be snapped-out of the cable retainer 340) when the they are pulled apart with sufficient force.

In this example loom 300A, the distance $d_4$ between adjacent tines 330 is approximately equal to a diameter of the cables that are to be retained in the loom 300A, so that the cables are held snuggly in the cable retainer 340 in a stacked configuration. As used herein, a stacked configuration means a configuration in which the cables are stacked one atop the other along a direction approximately parallel to a longitudinal axis of the tines. For example, cable locations 345 illustrated in FIG. 6B correspond to a stacked configuration.

In some examples, the cable retainers 340 may also include secondary retention features 344 that extend from the tines 330. The secondary retention features 344 are located between the bottom of the tine 330 and the snap-on retention features 341, and may be configured to retain a cable in a particular location within the cable retainer 340. For example, the secondary retention features 344 illustrated in FIG. 6B retain a bottom cable in a bottom cable location 345B, even when there is no cable in a top cable location 345A. The secondary retention features 344 may be separated from on another by a distance $d_5$, which is less than a diameter of the cables, so that they may retain the cables.

As another example, in a second example loom 300B (see FIG. 7), each cable retainer 340 includes a hooked cable retention feature 343. The hooked cable retention features 343 each extend from one tine 330 of the pair of tines 330 making up the cable retainer 340 towards the other tine. The hooked cable retention features 343 may be angled slightly towards the loom base 310. In some examples, the tine 330 from which the hooked cable retention feature 343 extends may be bent outward by the user while inserting or removing a cable to enlarge an opening of the cable retainer 340 that is defined by the hooked cable retention features 343. In some examples, the cable may be pressed against the top of the hooked cable retention feature 343 when being inserted, which may tend to force the tine 300 to bend outward to enlarge the opening and admit the cable; in such examples, the hooked cable retention feature 343 may be considered to be a type of snap-on retention feature.

As another example, in a third example loom 300C (see FIG. 8), each cable retainer 340 includes two oblique retention features 342. Each oblique retention feature 342 of a cable retainer 340 extends from one of the tines 330 of the cable retainer 340 towards the other tine 330, and a gap between the ends of the oblique retention features 342 defines an opening of the cable retainer 340. In this example, the opening of the cable retainer 340 is oblique, which means that it is diagonal relative to the front face of the loom 300B or a side face of a tine 330. More specifically, from a top-down perspective such as in FIG. 8B, a centerline of the opening, which is substantially parallel to the ends of both oblique retention features 342, is at an angle θ relative to the front face of the loom 300B, where 0<θ<90°. Because the opening is oblique, cables that are within the cable retainer 340 are unlikely to be able to pass through the opening unless then are intentionally guided through it. The oblique retention features 342 may include first oblique cable retention features 342A that extend from the tines 330 in one direction and second oblique cable retention features 342B that extend from the tines 330 in the opposite direction.

Figure 8C:
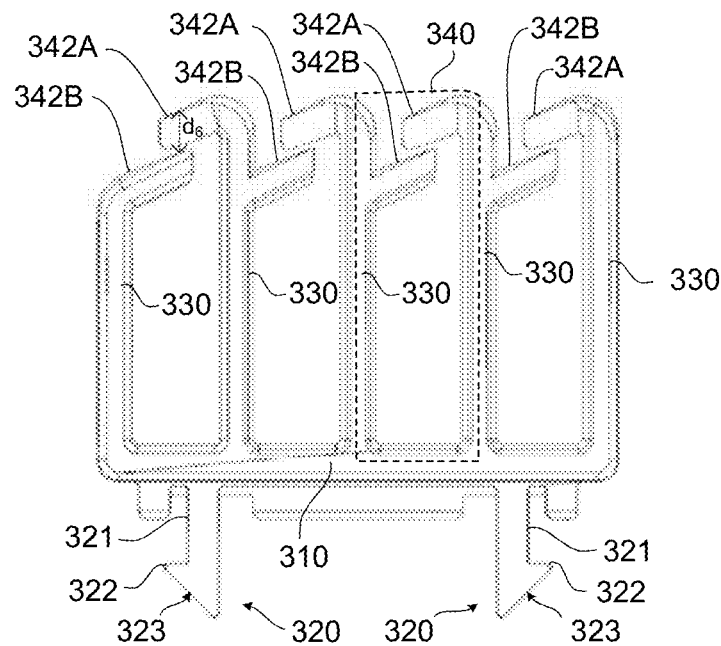

The first oblique cable retention features 342A may be angled downward slightly towards the loom base 310, while the second oblique cable retention features 342B may be angled upward slightly away from the loom base 310. The first cable retention features 342A may be positioned a distance $d_6$ higher than the first cable retention features 342A, as shown in FIG. 8C. These two aspects of the oblique cable retention features 342 may further help to ensure that cables are retained in the cable retainer 340, as cables that approach the opening are likely to be deflected away by a second oblique cable retention feature 342B into the first oblique cable retention feature 342A.

The example looms 300A, 300B, and 300C may be designed to hold different types of cables. For example, the first example loom 300A may be designed to hold a cable having a substantially larger diameter than cables to be held by the second and third example looms 300B, 300C. As another example, the first example loom 300A may be designed to hold a cable that is robust enough to withstand the forces involved in snapping-into and snapping-out of the snap-in retention features 341.

Thus, for example, the first example loom 300A may be for large electrical cables (e.g., copper wire cables), but may be less well suited to hold optical cables. An advantage of the first example loom 300A is that it holds two cables per cable retainer 340 in a stacked configuration, which makes tracing cables very easy and enables easy cable removal such that in order to remove one cable from the loom 300A at most one additional cable would also have to be removed from the loom 300A.

The second and third looms 300B, 300C, on the other hand, may be for holding optical cable. The optical cables may have smaller diameters and be more delicate. Snug fits and pinching are generally to be avoided with optical cables, as it may damage them. Thus, the second and third looms 300B, 300C include the hooked retention features 343 and oblique retention features 342 to retain the optical cables without pinching them or holding them too snugly. The second loom 300B may be designed to hold first optical cables having a first diameter, while the third loom 300C may be designed to hold second optical cables having a second diameter that is smaller than the first diameter.

As noted above, in the illustrated examples, the loom 300 is attachable and removable from the loom retainer 220, but in other examples the clip 200 may be permanently connected to the loom 300. In examples in which the clip 200 is permanently connected to the loom 300, the snap-in latches 320 and the corresponding features of the loom retainer 220 may be omitted, and the tines 330 of the loom 300 may be connected directly to the c-shaped snap-on feature 210 or to an intermediary portion to which the c-shaped snap-on feature 210 is connected.

3. Example Computing System

Figure 9:
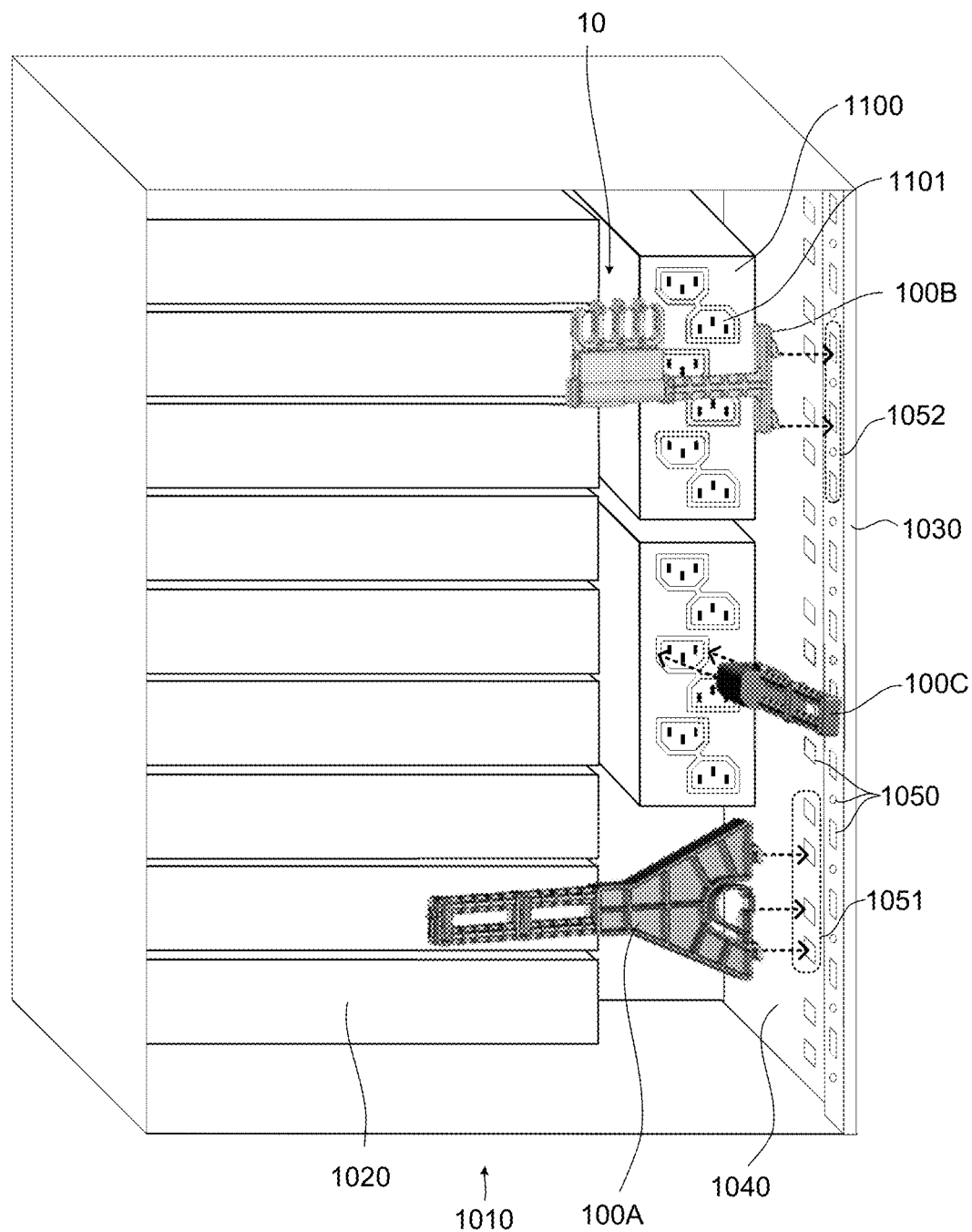
FIG. 9 is a conceptual diagram illustrating an example computer system.
Figure 10:
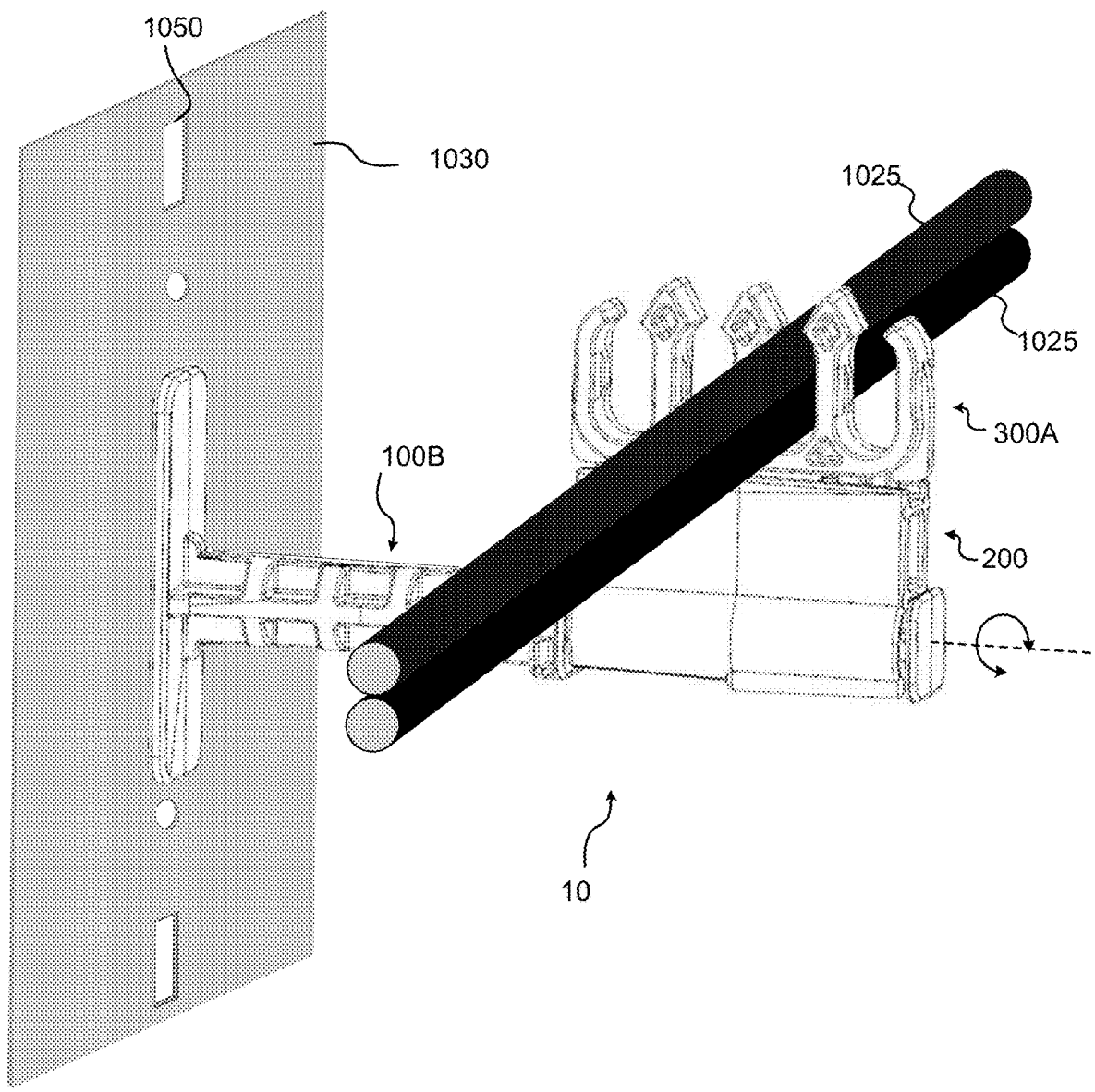
FIG. 10 illustrating a portion of the example computer system that includes an example modular cable management system.
Figure 12:
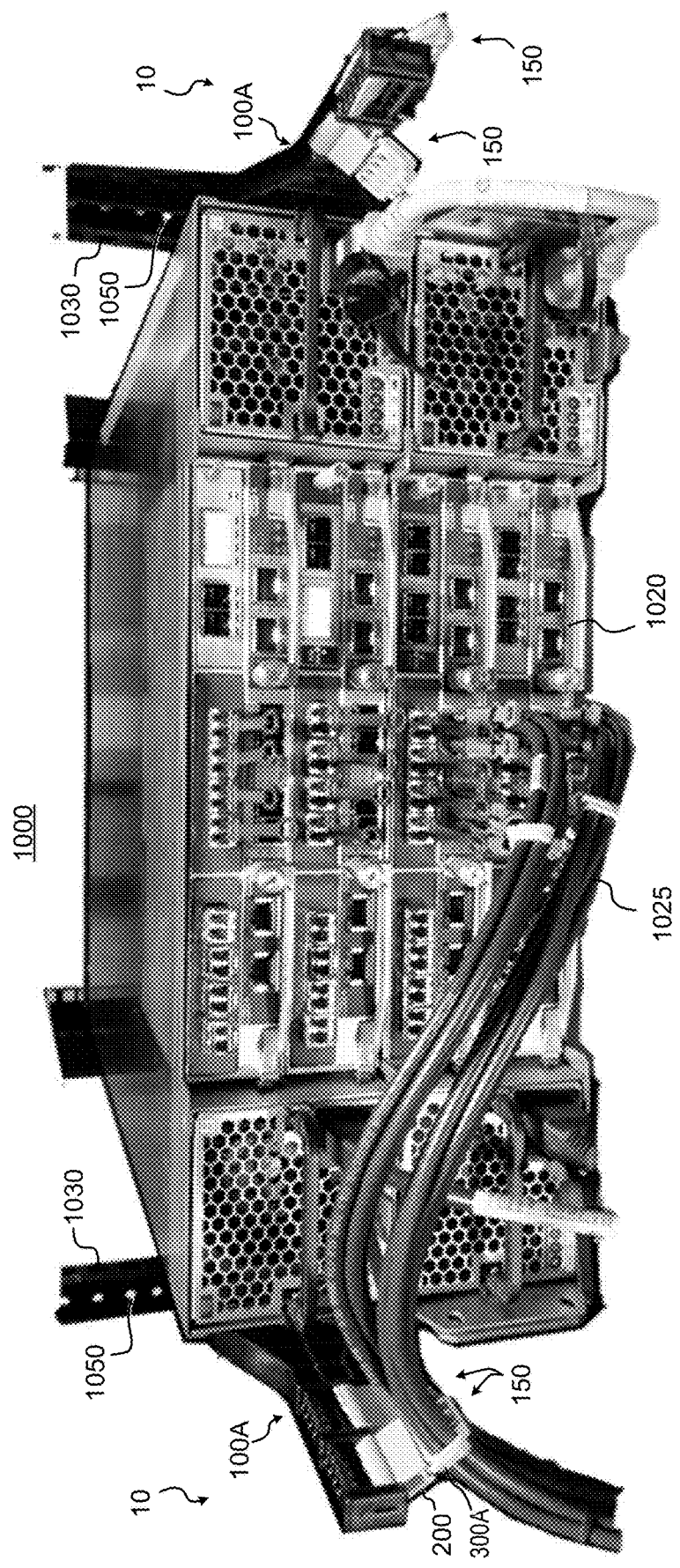
FIG. 12 is a picture of an example computer system with an example modular cable management system installed therein.
Figure 13:
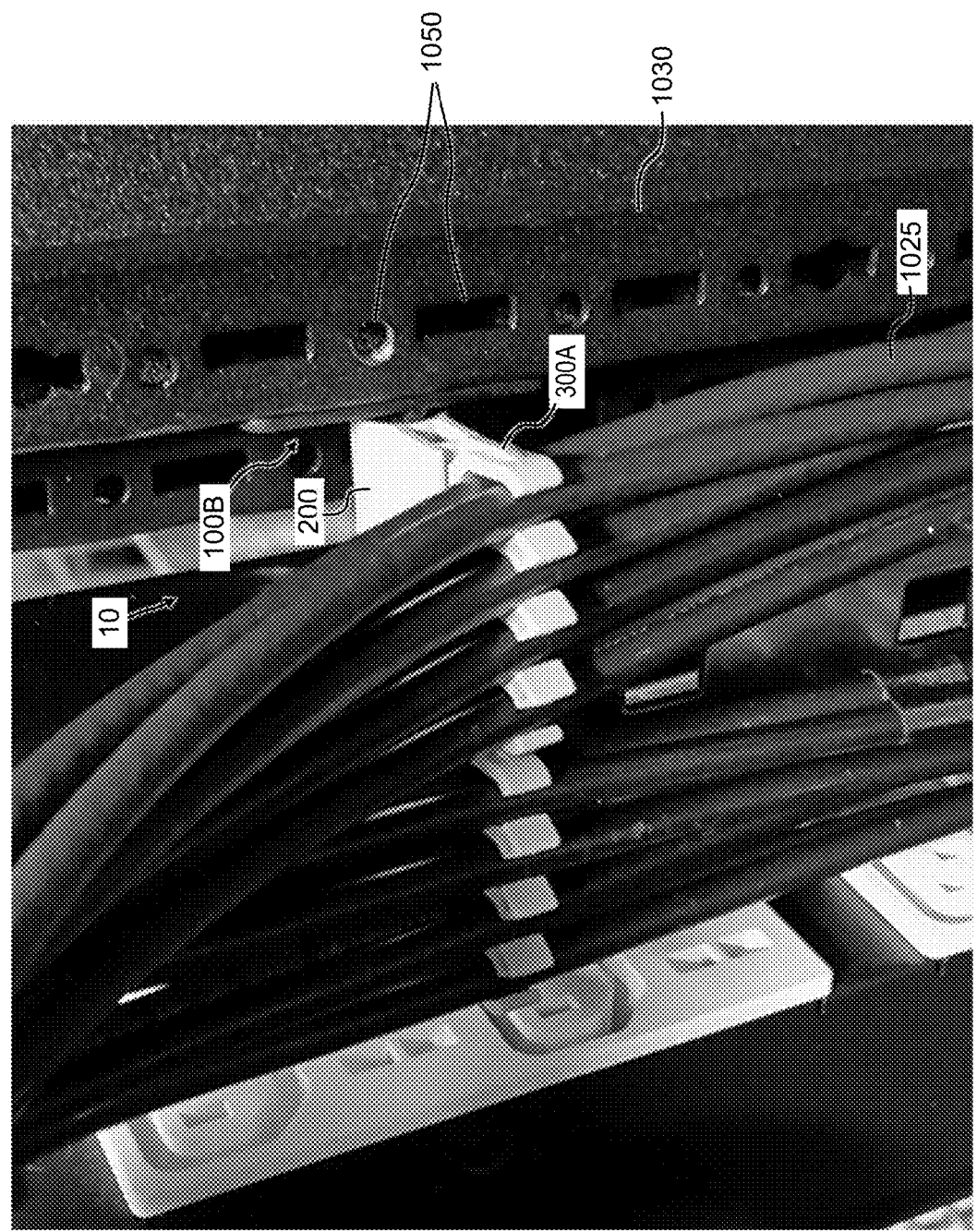
FIG. 13 is a picture of a portion of an example computer system with an example modular cable management system therein.

FIG. 9 illustrates an example computing system 1000 that utilizes the modular cable management system 10. FIGS. 10, 12 and 13 illustrate portions of specific implementations of the computing system 1000.

The system 1000 includes an enclosure 1010, devices 1020 housed within the enclosure 1010, cables 1025 connected to one or more of the devices 120, and at least one instance of the modular cable management system 10 attached to a supporting structure of the enclosure 1010 and holding multiple of the cables 1025.

The devices 1020 may include computing devices, networking devices, storage devices, or any other electronic devices. Any number of devices 1020 may be included within the enclosure 1101.

The enclosure 1010 may be any structure that supports and/or houses the devices 1020, such as a rack, cabinet, etc. The enclosure 1010 may be, but does not have to be, fully enclosed—for example, the enclosure 1010 could be a rack having columns but no walls.

The supporting structure of the enclosure 1010 may be any structure that is part of the enclosure 1010 that is capable of vertically supporting the modular cable management system 10. For example, the supporting structure may be a column 1030 of the enclosure (such as a rack column). As another example, the supporting structure may be a wall 1040 of the enclosure (such as a wall of a cabinet). In addition, the supporting structure of the enclosure 1010 may be any structure that is attached to the enclosure 1010 and/or housed within the enclosure 1010 that is capable of vertically supporting the modular cable management system 10. For example, the supporting structure may be an electrical socket 1101 of a PDU 1100 that is included within the enclosure 1010.

As noted above, one or more modular cable management systems 10 may be installed in the system 1000. This may include attaching the base 100 to the support structure, and attaching at least one cable management module 150 to an arm 131 of the base 100. Example attachment locations for the modular cable management systems 10 are indicated in FIG. 9, but this is merely for purposes of illustration and it should be understood that support structures and/or holes could be located at different places throughout the enclosure 1010 such that modular cable management systems 10 could be attached at different locations and orientation than those shown in FIG. 9.

FIGS. 10, 12, and 13 illustrate additional specific implementation examples of the system 1000. FIG. 10 illustrates such an example with a modular cable management system 10 utilizing the second example base 1008 installed within the system 1000. Cables 1025 that are connected to one or more of the devices 1020 are held by the loom 300 of the cable management module 150. The cable management module 150 is rotatable about a longitudinal axis of the arm 131 of the base 100.

In FIG. 12, two modular cable management systems 10 utilizing the first example base 100A are attached to columns 1030 of a rack. In the example, four cable management modules 150 utilizing the first example looms 300A are attached to the two modular cable management systems 10.

In FIG. 13, a modular cable management system 10 utilizing the second example base 100B is attached to a columns 1030 of a rack. In the example, two cable management modules 150 utilizing the first example looms 300A are attached to the modular cable management system 10.

In some examples, the supporting structure may include holes 1050. FIG. 9 illustrates two different patterns of holes in the enclosure 1010, having different hole-shapes, hole-sizes and hole-spacings. However, this is just for purposes of illustration, and it should be understood that different sizes, shapes, and spacing of holes 1050 may be included within the system 1000. A first pattern 1051 of holes 1050 may match the hooks 114 and protrusion 117 of the first example base 100A. For example, the wall 1040 includes the first pattern 1051 of holes 1050, and therefore the first base 100A may be attached thereto. A second pattern 1052 of holes may match the hooks 114 and protrusion 117 of the second example base 1008. For example, the column 1030 includes the second pattern 1052 of holes 1050, and therefore the first base 100A may be attached thereto. In some examples, the system 1000 includes a PDU 1100. In such examples, the third base 100C may be attached to an electrical socket 1101 of the PDU 1100.

In some examples, multiple modular cable management systems 10 may be used within the same system 1000. In some examples, modular cable management systems 10 having different types of bases 100 may be used in the same system 1000.

4. Example Method

Figure 11:
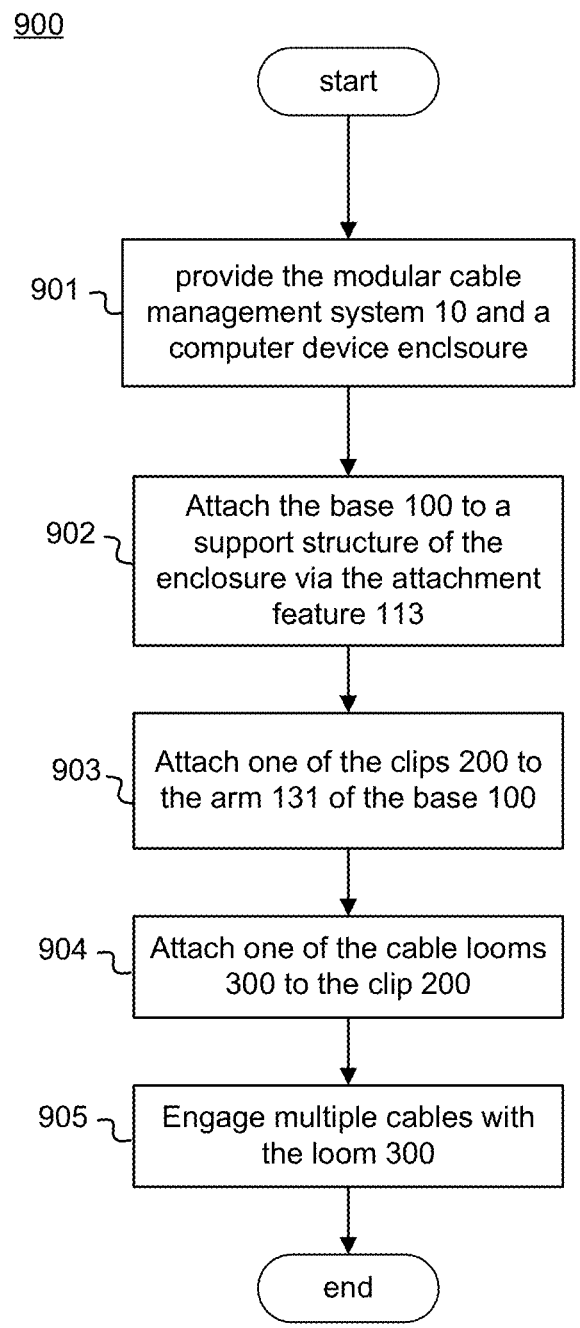
FIG. 11 illustrates a process flow chart for an example method.

FIG. 11 illustrates an example method of using the modular cable management system 10.

At block 901, an instance of the modular cable management system 10 is provided, and a computer device enclosure, such as the enclosure 1010, is provided.

At block 902, the base 100 is attached to a support structure of the enclosure via the attachment feature 113 of the base 100.

At block 903, one of the clips 200 is attached to the arm 131 of the base 100. For example, this may include snaping the clip 200 on the arm using the c-shaped snap-on feature 210.

At block 904, one of the looms 300 is attached to the clip 200. For example, this may include sliding the snap-in latches 320 into the loom cavity 224 of the clip 200. In some examples in which the loom 300 is already attached to the clip 200, block 904 may be omitted.

At block 905, multiple cables are engaged with the loom 300. In other words, the cables are inserted into one or more cable retainers 340 if the loom 300 so that the cable retainers 340 hold (retain) the cables.

5. List of Reference Numerals 10 modular cable management system ("system")
100 base (also 100A, 1006, 100C)
110 attachment portion
111 frame
112 truss
113 attachment feature
114 hook
115 connector
125 cavity
116 lock
117 protrusion
118 cantilever
119 pull
120 latch
121 tab
122 cantilever
130 arm portion
131 arm
132 divider
133 clip attachment location 100
150 cable management module
200 clip
210 c-shaped snap-on feature
211 curved wall
212 mold ejector aid
213 contact surface (also 213A, 213B)
214 channel
215 opening
220 loom retainer
223 vertical support walls
224 loom cavity
225 horizontal walls
226 release opening
300 loom (also 300A, 200B, 300C)
310 loom base 320 snap-in latch
321 cantilever
322 detent
323 contact surface
330 tine
340 cable retainer
341 snap-on cable retention feature
342 oblique cable retention feature (also 342A, 342B)
343 hooked cable retention feature
344 secondary retention feature
345 cable location 5. Definitions Provide: As used herein, to "provide" an item means to have possession of and/or control over the item. This may include, for example, forming (or assembling) some or all of the item from its constituent materials and/or, obtaining possession of and/or control over an already-formed item.

Approximately: As used herein, terms of approximation such as approximately, roughly, about, substantially, etc., when used in relation to a direction or orientation, mean within ±10° of the specified direction or orientation. When such terms of approximation are used in relation to quantifiable physical qualities or relations such as distance, length, mass, conductivity, etc., they mean within ±10% of the specified quantity.

A number. Throughout this disclosure and in the appended claims, occasionally reference may be made to "a number" of items. Such references to "a number" mean any integer greater than or equal to one. When "a number" is used in this way, the word describing the item(s) may be written in pluralized form for grammatical consistency, but this does not necessarily mean that multiple items are being referred to. Thus, for example, a phrase such as "a number of active optical devices, wherein the active optical devices . . . " could encompass both one active optical device and multiple active optical devices, notwithstanding the use of the pluralized form.

The fact that the phrase "a number" may be used in referring to some items should not be interpreted to mean that omission of the phrase "a number" when referring to another item means that the item is necessarily singular or necessarily plural.

In particular, when items are referred to using the articles "a", "an", and "the" without any explicit indication of singularity or multiplicity, this should be understood to mean that there is "at least one" of the item, unless explicitly stated otherwise. When these articles are used in this way, the word describing the item(s) may be written in singular form and subsequent references to the item may include the definite pronoun "the" for grammatical consistency, but this does not necessarily mean that only one item is being referred to. Thus, for example, a phrase such as "an optical socket, wherein the optical socket . . . " could encompass both one optical socket and multiple optical sockets, notwithstanding the use of the singular form and the definite pronoun.

And/or. Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Various example processes were described above, with reference to various example flow charts. In the description and in the illustrated flow charts, operations are set forth in a particular order for ease of description. However, it should be understood that some or all of the operations could be performed in different orders than those described and that some or all of the operations could be performed concurrently (i.e., in parallel).

While the above disclosure has been shown and described with reference to the foregoing examples, it should be understood that other forms, details, and implementations may be made without departing from the spirit and scope of this disclosure.

What is claimed is:

1. A modular cable management system, comprising:
   a base that includes:
     an attachment feature that is to attach to a supporting structure to vertically support the base, and
     an arm that extends from the attachment feature, the arm extending perpendicularly away from the supporting structure and defining a longitudinal axis perpendicular to the supporting structure;
   a number of clips, each clip being directly attachable to the arm and encircling the arm such that each clip is rotatable about the longitudinal axis of the arm and is removable from the arm without the use of tools;
   a number of cable looms, each cable loom including a loom base, snap-in latches extending from a bottom of the loom base and multiple tines extending from a top of the loom base, each cable loom being attachable to and removable from one of the clips, and configured to hold multiple cables.

2. The modular cable management system of claim 1, wherein the supporting structure is a part of a computing device enclosure, and the attachment feature of the base includes two hooks that are to engage with two holes in the supporting structure.

3. The modular cable management system of claim 1, wherein the arm is capable of having multiple of the clips connected thereto simultaneously.

4. The modular cable management system of claim 1, wherein the base includes a second arm that extends from the attachment feature, each of the clips also being attachable to the second arm such that the clip is rotatable about a longitudinal axis of the second arm and removable from the second arm.

5. The modular cable management system of claim 1, wherein at least one of the clips includes a c-shaped snap-on feature that is to snap onto and snap off of the arm and a loom retention feature extending from the c-shaped snap-on feature, the loom retention feature to engage with the cable loom.

6. The modular cable management system of claim 5, wherein the cable loom includes snap-in latches that are to snap into the loom retention feature of the clip to latch the cable loom to the clip.

7. The modular cable management system of claim 1, wherein the multiple tines of the cable loom form multiple cable retainers, each of the cable retainers being formed by two of the tines and being configured to hold multiple cables.

8. The modular cable management system of claim 7, wherein, for a first cable loom of the cable looms, each of the cable retainers thereof includes snap-on retention features on the tines that form the cable retainer to enable the cable retainer to snap-onto and retain cables.

9. The modular cable management system of claim 8, wherein, for the first cable loom, each of the cable retainers is to hold the cables in a stacked configuration.

10. The modular cable management system of claim 8, wherein, for the first cable loom, each of the cable retainers includes secondary retention features inside the cable retainer.

11. The modular cable management system of claim 7, wherein, for a second cable loom of the cable looms, each of the cable retainers thereof includes two retention features that each extend from one of the tines of the cable retainer towards the other tine of the cable retainer, the retention features defining an opening through which a cable may be inserted into the cable retainer, the opening being oblique relative to the tines.

12. The modular cable management system of claim 7, wherein, for at least one of the cable looms, each of the tines except for a last tine includes a hooked cable retention feature at an end thereof that extends toward a next one of the tines and is to retain cables in one of the snap-in cable retainers.

13. The modular cable management system of claim 1, wherein the cable looms include at least a first cable loom and a second cable loom, the first and second cable looms having differently configured tines.

14. The modular cable management system of claim 1, wherein each of the clips is attachable to and removable from the arm without threaded fasteners.

15. The modular cable management system of claim 1, wherein each of the cable looms is attachable to and removable from one of the clips without tools or threaded fasteners.

16. A method, comprising:
providing the modular cable management system of claim 1,
providing a computer device enclosure that includes the support structure;
attaching the base to the support structure via the attachment feature;
attaching one of the clips to the arm of the base;
attaching one of the cable looms to the one of the clips;
engaging multiple cables with the one of the cable looms.

17. The modular cable management system of claim 1, wherein the supporting structure is an electrical socket of an electrical power distribution unit, and the attachment feature of the base includes a connector that is to mate with the electrical socket so as to vertically support the base.

* * * * *